(12) United States Patent
Lee et al.

(10) Patent No.: US 6,683,469 B2
(45) Date of Patent: Jan. 27, 2004

(54) REGULABLE TEST INTEGRATED CIRCUIT SYSTEM FOR SIGNAL NOISE AND METHOD OF USING SAME

(75) Inventors: Min-Lin Lee, Hsinchu (TW); Chin-Sun Shyu, Pingtung Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 43 days.

(21) Appl. No.: 09/858,538

(22) Filed: May 17, 2001

(65) Prior Publication Data

US 2002/0024353 A1 Feb. 28, 2002

(30) Foreign Application Priority Data

Aug. 30, 2000 (TW) ........................................ 89117568 A

(51) Int. Cl.[7] .............................................. G01R 31/02
(52) U.S. Cl. ..................................... 324/765; 324/158.1
(58) Field of Search ............................... 324/765, 158.1, 324/613, 614, 616, 754, 760, 758, 72.5; 714/724, 719; 438/17–19; 365/201

(56) References Cited

U.S. PATENT DOCUMENTS

| | | | | |
|---|---|---|---|---|
| 3,778,704 A | * | 12/1973 | Lubarsky, Jr. et al. | 324/613 |
| 4,360,928 A | * | 11/1982 | Campbell | 324/613 |
| 5,166,625 A | * | 11/1992 | Guiga et al. | 324/613 |
| 6,043,662 A | * | 3/2000 | Alers et al. | 324/765 |
| 6,114,858 A | * | 9/2000 | Kasten | 324/616 |

* cited by examiner

*Primary Examiner*—Kamand Cuneo
*Assistant Examiner*—Jimmy Nguyen
(74) *Attorney, Agent, or Firm*—Birch, Stewart, Kolasch & Birch, LLP

(57) ABSTRACT

A regulable test IC system for signal noise on the electrical analysis point, comprising: a power supply, for providing a test voltage in the system; a pulse generator, for providing a test frequency in a noise testing of the system; a regulable test IC with different signal pads capable of regulable testing signal noise with the test frequency from the pulse generator and the test voltage from the power supply in a plurality of built-in specific structures, under the basis of an assigned current standard; and a digital detection device with a display, for displaying and recording the result of the regulable test.

5 Claims, 12 Drawing Sheets

REGULABLE TEST INTEGRATED CIRCUIT SYSTEM FOR SIGNAL NOISE AND METHOD OF USING SAME

BACKGROUND OF THE INVENTION

1. Field of the Invention

The present invention relates to a system and method of testing an integrated circuit (IC) for signal noise, and especially to a regulable test IC system for signal noise and method of using the same.

2. Description of Related Art

The top operating frequency of a digital IC (e.g., an Intel CPU) has increased from 500 MHz to 1000 MHz. With increasingly integrated systems and faster operating frequency, the performance requirement of a CPU is becoming even stricter. However, a higher operating frequency can result in problems resulting from electrical noise. Therefore, from the viewpoint of electrical analysis, noise detection and measurement of integrated circuit package (IC package), connector, and printed circuit board substrate (PCB substrate) for noised incurred as a result of increased CPU operating frequency are necessary. For example, test reflection noise from Impedance Mis-Match, cross-talk from many parallel lines, and switching noise from logic gates transited concurrently exert an influence on a variety of IC packages/connectors/PCBs during operation. The design of Shrink Small Outline Package (SSOP), Plastic Quad Flat Package (PQFP), Plastic Ball Grid Array (PBGA), Chip Size Package (CSP), Flip chip, Build-up, and Built-in for high frequency response must take into account the influence of noise on the associated executable highest frequency response.

Typically, this problem is solved using a 2D/3D software simulation analysis for evaluation. However, the use of algorithms and the high operating frequency limit the effectiveness of 2D/3D software simulation analysis, and it lacks the flexibility to cope with the changed environment and the interactive relation of circuits. For example, software simulation can calculate the values of parts of a 3D structure such as LCR (i.e. inductance, capacitance, and resistance) values of a wire bond. However, software simulation can not appropriately calculate the required values for a 3D structure includes a structure greater than two discontinuous geometries. More, when a bus's operating frequency is over 133 MHz or an IC's operating frequency is over 1000 MHz, the demand of accuracy is stricter, further limiting the usefulness of software simulation. As a result, software simulation can not achieve the accuracy demanded from a noise limit requirement.

SUMMARY OF THE INVENTION

Accordingly, an object of the invention is to provide a test system and method of using it in the form of hardware, for directly testing the response of a noise on a variety of package designs, connectors, and PCB substrates.

Another object of the invention is to provide a regulable test system and method for testing the noise of a digital signal on a package, even in a 3D environment.

The invention provides a regulable test IC system for signal noise on the electrical analysis point. The regulable test IC system comprises: a power supply, for providing a test voltage in the system; a pulse generator, for providing a test frequency in a noise testing of the system; a regulable test IC with different signal pads capable of regulable testing signal noise with the test frequency from the pulse generator and the test voltage from the power supply in a plurality of built-in specific structures, under the basis of an assigned current standard; a digital detection device with a display, for displaying and recording the result of the regulable test.

The invention also provides a method of performing in the regulable test IC for signal noise test. The method comprises the steps: connecting a target to be tested to the regulable test IC according to an assigned signal ratio (total signal pins to Quiet signal pins); setting a test voltage on a power supply and a test frequency on a pulse generator; choosing a current standard; using a digital detection device with a display to test signal noise of the target to be tested with the test frequency and the test voltage in a plurality of built-in specific structures, under the chosen current standard; displaying and recording the resulting value.

The invention overcomes the limitations of software analysis in the form of hardware. The present invention allows the analysis of the noise situation from the real-time display of the digital detection device. Using the real-time display, an IC factory can analyze the resulting data and obtain the high-frequency response of a variety of IC packages/connectors/PCBs and the executable highest response. Accordingly, the factory can obtain optimized high-frequency electrical designs of an IC package and miniature packing designs, thereby avoiding cost waste from error selection and over design typical with software analysis.

BRIEF DESCRIPTION OF THE DRAWINGS

The invention will become apparent by referring to the following detailed description of a preferred embodiment with reference to the accompanying drawings, wherein.

DETAILED DESCRIPTION OF THE INVENTION

Figure 1:
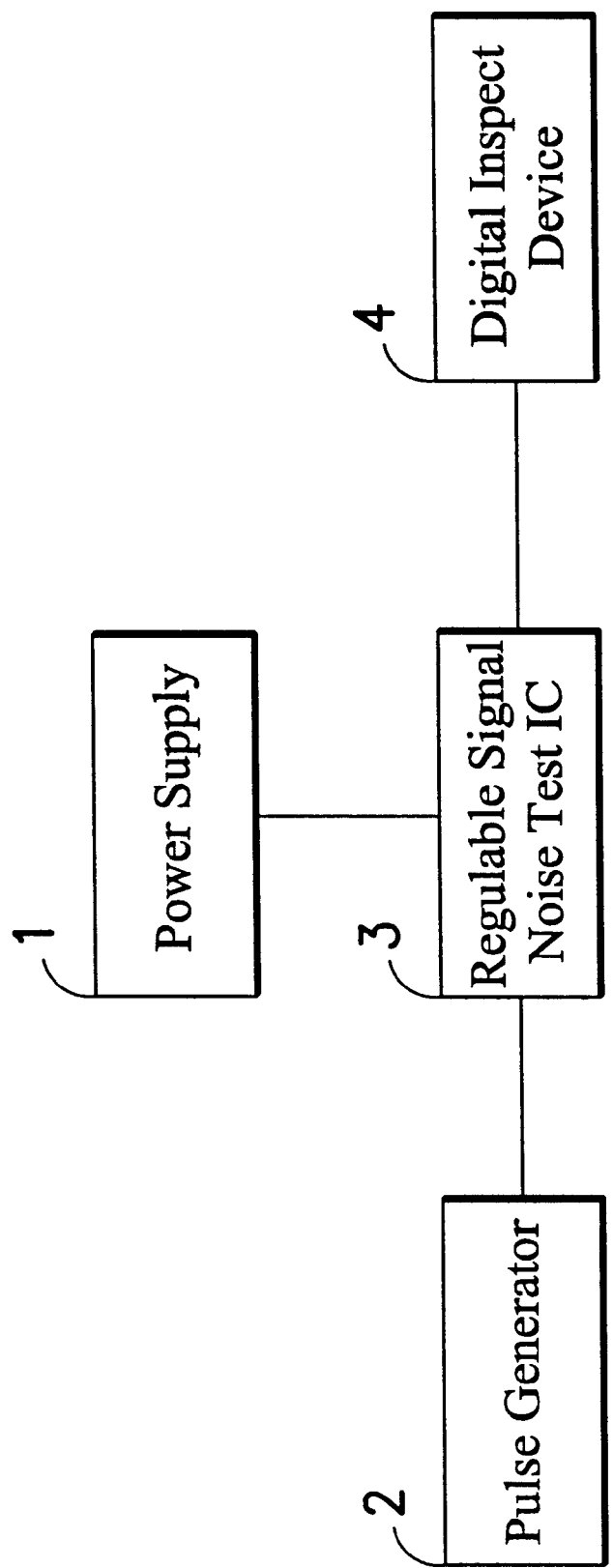
FIG. 1 is a block diagram illustrating a regulable test IC system of the invention.
Figure 2A:
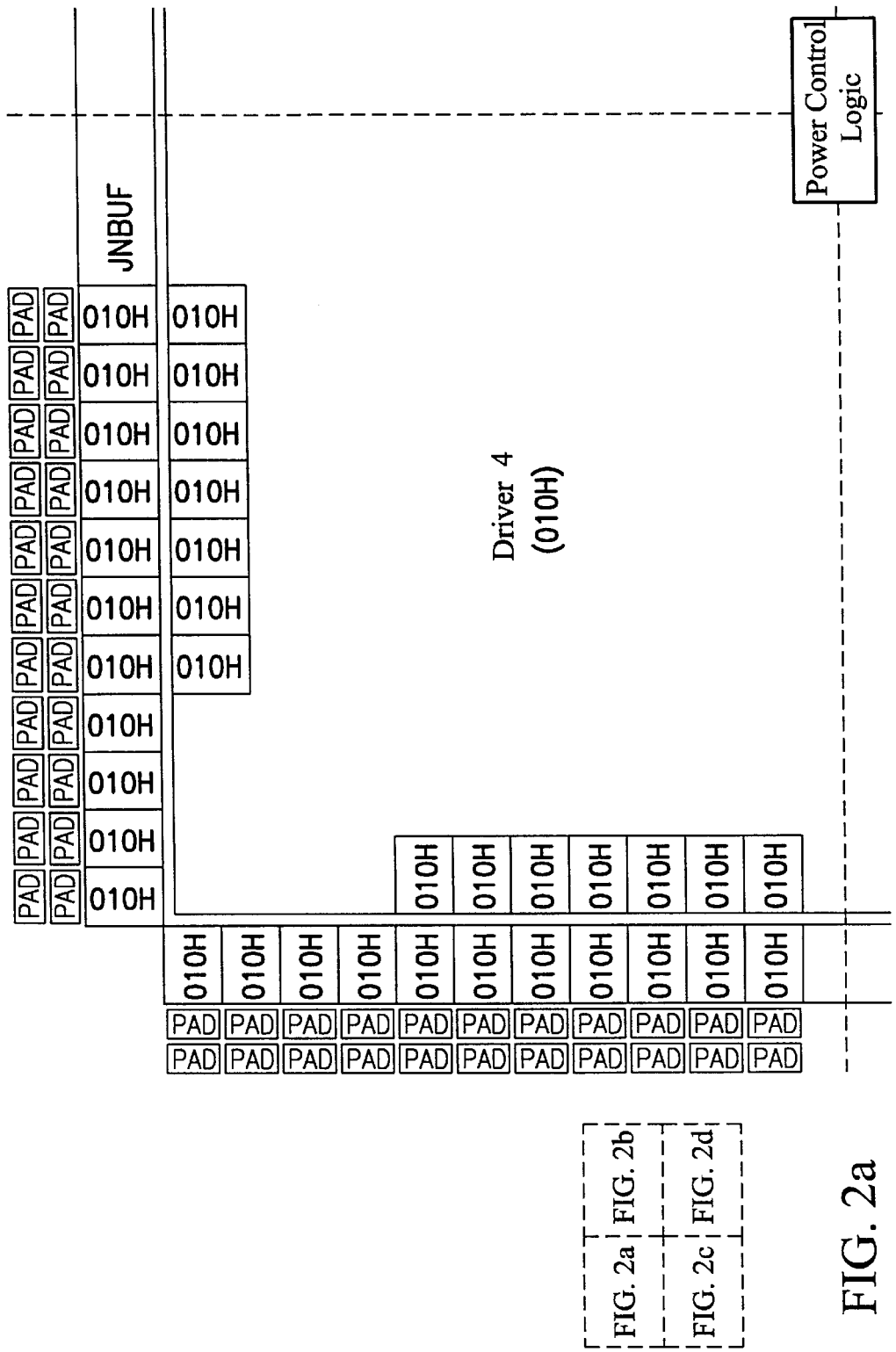
FIG. 2 is a schematic diagram illustrating different current drivers of the invention.
Figure 2B:
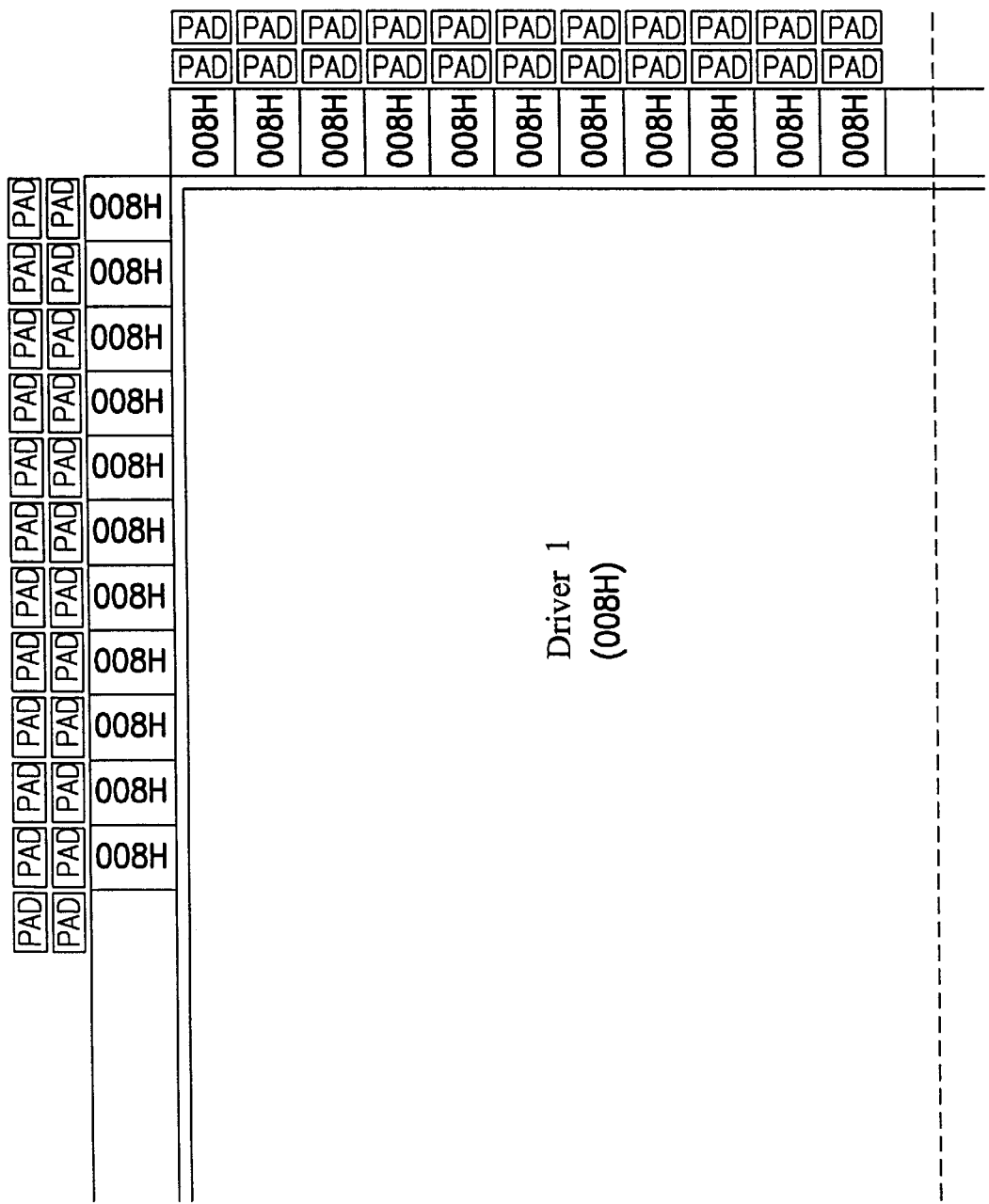
Figure 2C:
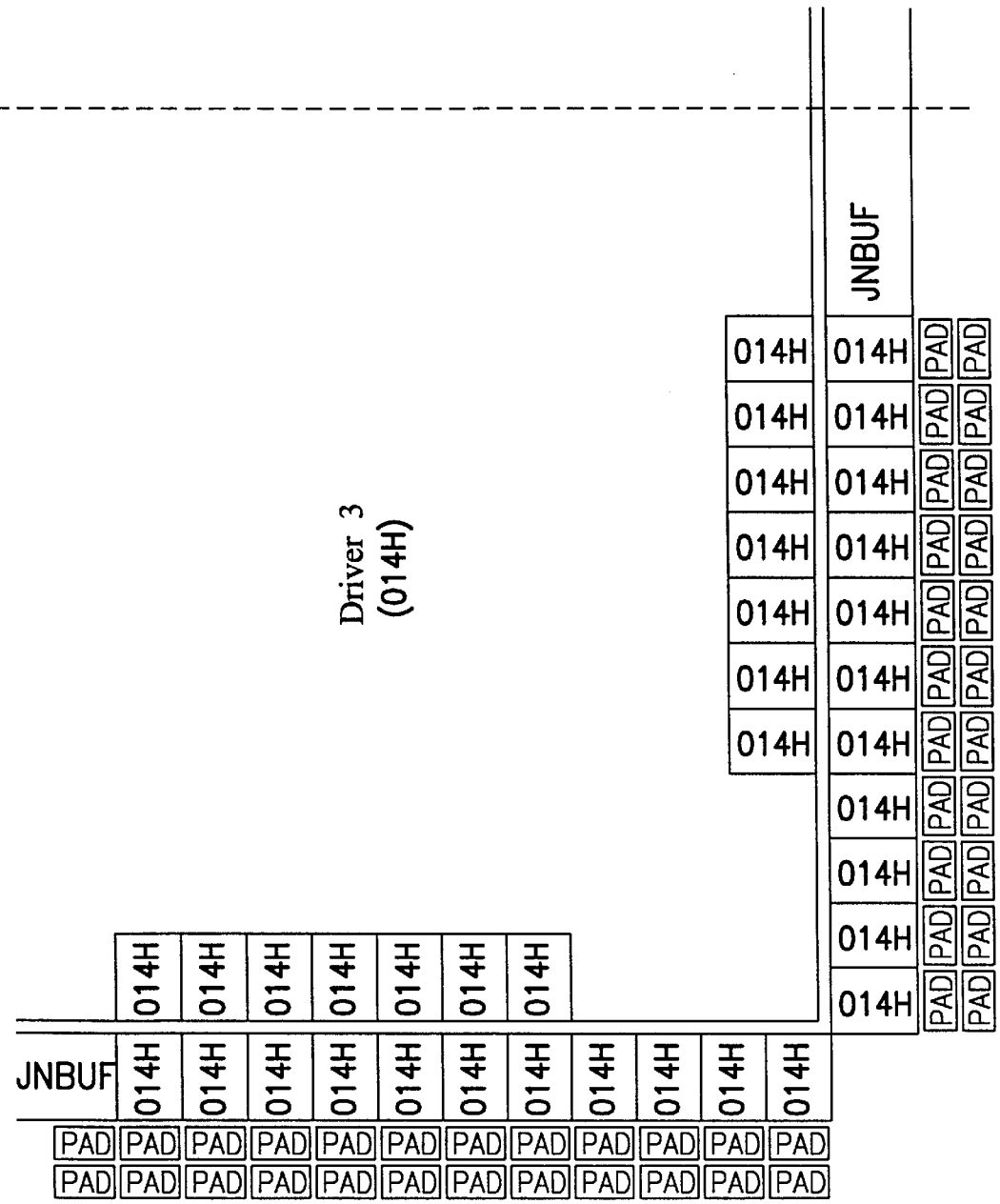
Figure 2D:
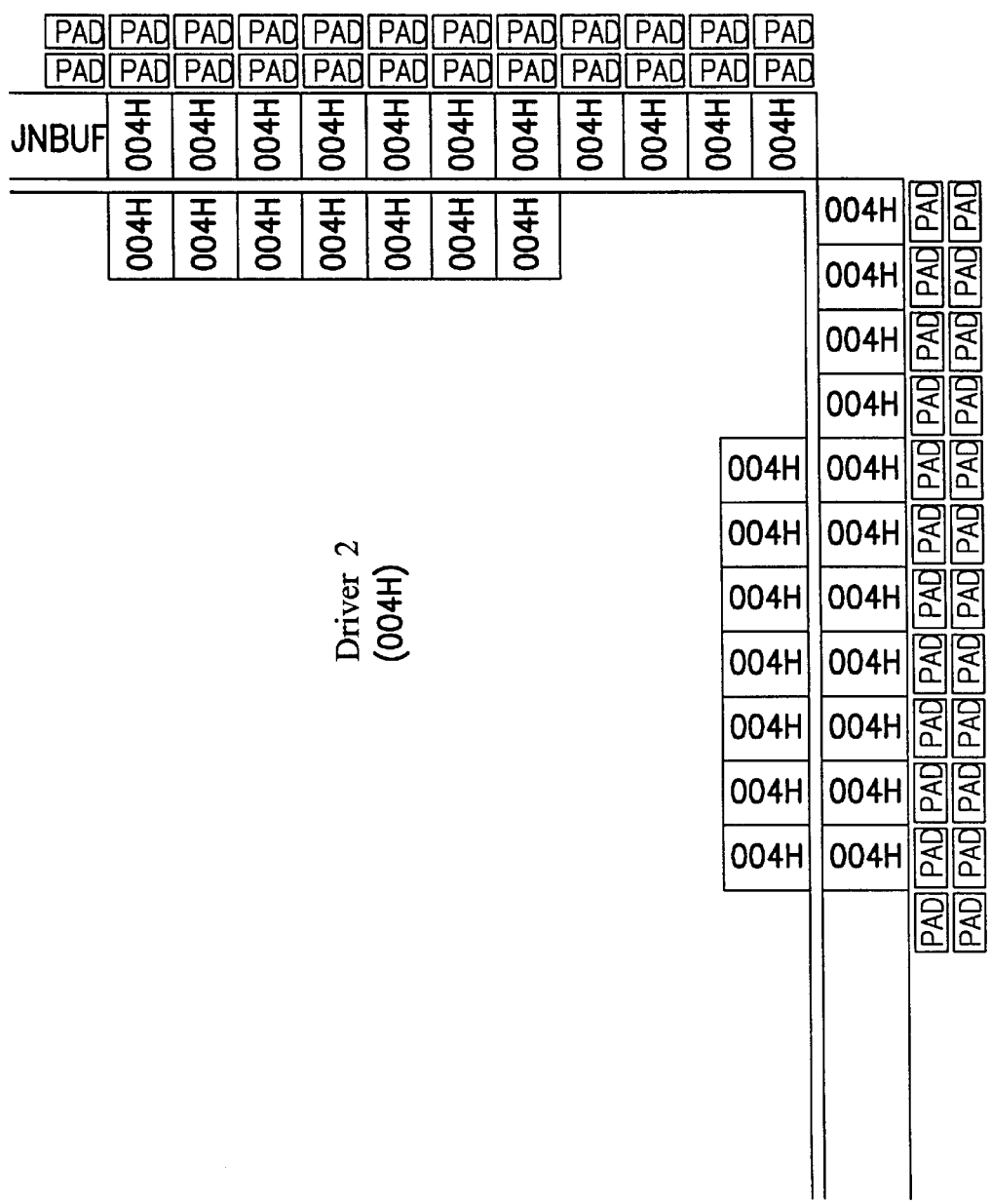

Refer to FIG. 1, a block diagram of a regulable test IC system. In FIG. 1, the system comprises: a power supply 1; a pulse generator 2; a regulable test IC 3; and a digital detection device 4.

As shown in FIG. 1, the test IC 3, after being bonded by a typical gold wire and packed as a package, is connected with the power supply 1, the pulse generator 2, and the digital detection device 4 to form the test system of the invention. The power supply 1 is responsible for providing the required test voltage to this test system so as to gene-frequency the required current standards during a test, for example 4 mA, 8 mA, 10 mA, and 14 mA. The pulse generator 2 is responsible for providing the required test frequency during a test. The regulable test IC 3 is responsible for transforming the test voltage and the test frequency into a specific noise waveform used to test a noise value of a target. The digital detection device 4, e.g. an oscilloscope, is responsible for displaying and recording the resulting noise value (see Appendix A) on the display (not shown).

Figure 3:
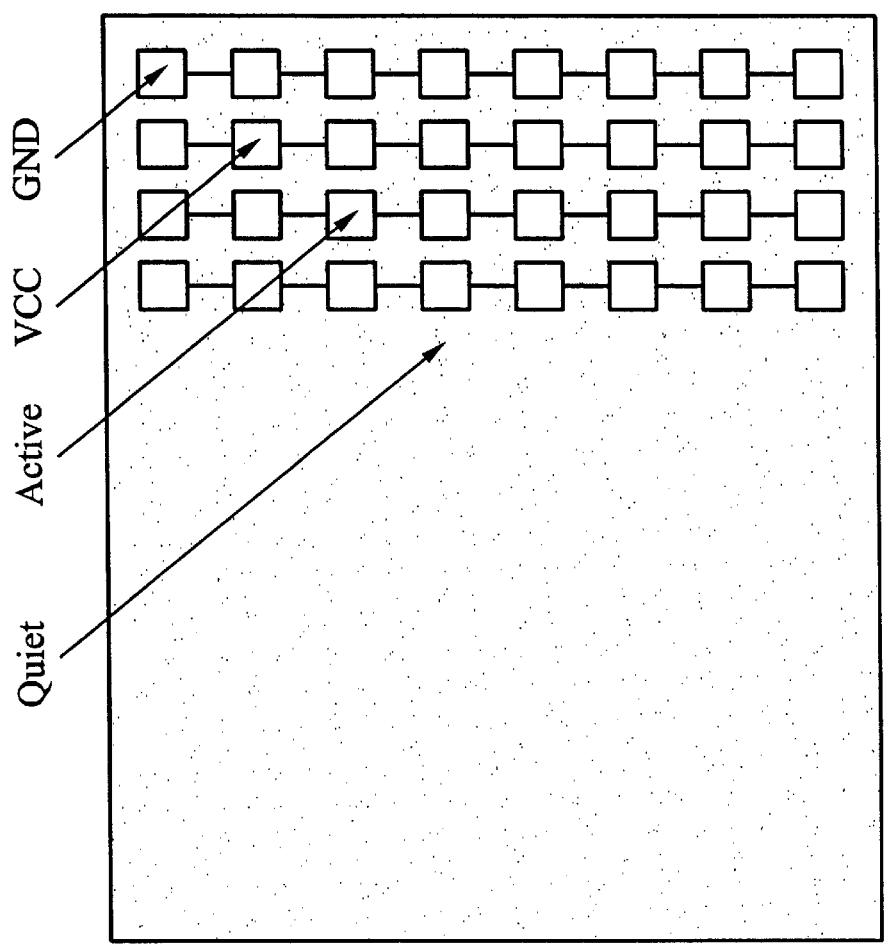
FIG. 3 is a multiple parallel structure of the invention.
Figure 4:
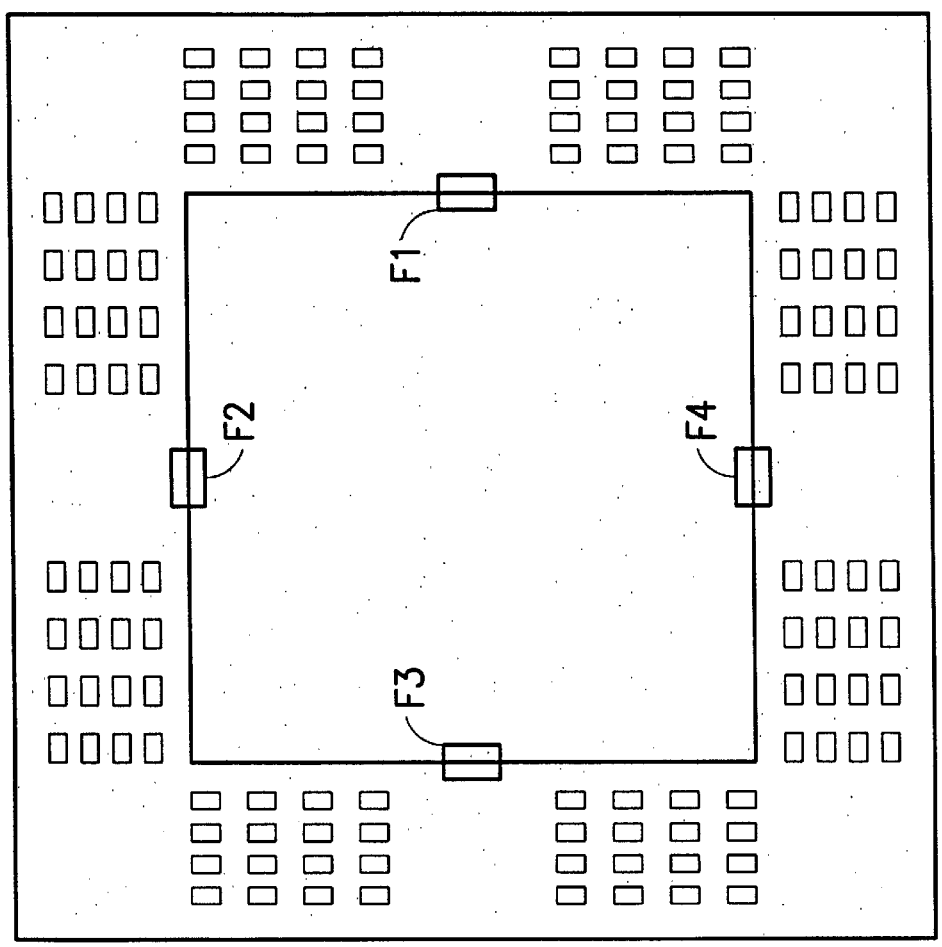
FIG. 4 is a serial frequency input structure of the invention.
Figure 5:
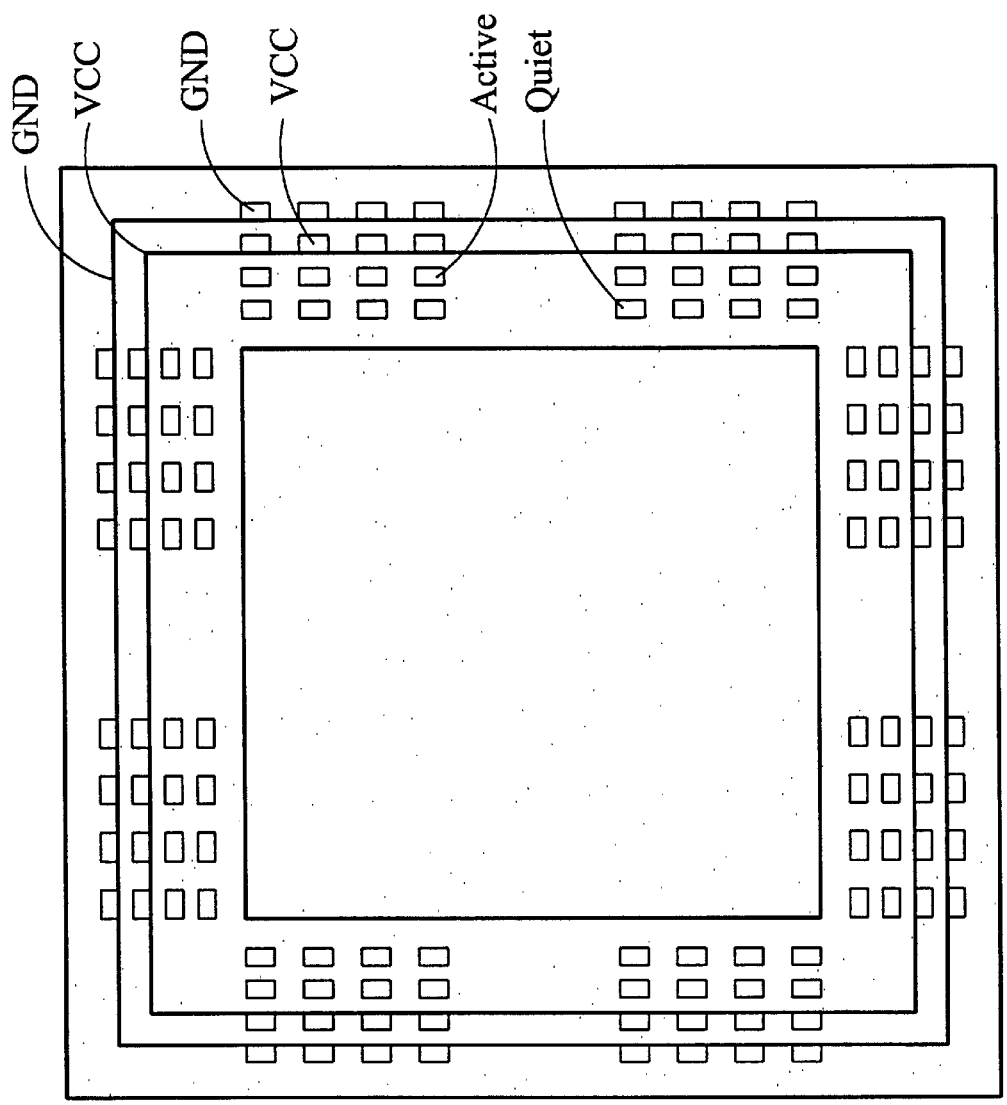
FIG. 5 is a partial circle structure of the invention.

Refer to FIGS. 2–5, further illustrating a general configuration of the regulable test IC of the invention. In FIG. 2, different current drivers of the invention are schematically shown. The implementation of these current drivers is based on current IC test factory's standards. As shown in FIG. 2, four current drivers are used and distributed on four quadrants in order to find the longest leadframe of a target (package device) to be tested or the noise voltage on a bus line. In FIG. 3, a multiple parallel structure of the invention is shown. The ratio of the number of wiring to Active+Quiet pads with respect to the number of wiring to Quiet pad(s) is referred to as a signal ratio (i.e. Active+Quiet lines: Quiet line(s)). To solve the problem of different signal ratios having different responses for a specific frequency, that is, in order to solve the problem of different signal ratios having different noise voltage values, the geometric signal pad structure is arranged as shown in FIG. 3 (hereinafter referred to as a multiple parallel structure) such that the signal pads in each column (Quiet, Active, VCC, and GND) respectively have the same voltage value due to the sepafrequency serial connection. In other words, each pad in the Quiet column has a Quiet (no signal) potential, each pad in the Active column has an Active (signal) potential, each pad in the VCC column has an input potential, and each pad in the GND column has a ground potential. Accordingly, the wire bonding sequence of a target to be tested can be changed according to a signal ratio assigned by a user, thereby providing a flexible method of generating a variety of waveforms with different signal ratios. In FIG. 4, a serial frequency input structure is schematically shown. To test the influence of a variety of frequencies to a noise voltage, the clock inputs F1, F2, F3, and F4 of the four quadrants are serially connected to be a loop as shown in FIG. 4. Thus, each current driver in the four quadrants can be activated from any one of the inputs. A user can input different frequencies, for example, 100 MHz to 300 MHz, external to the test IC from the pulse generator 2, thereby acquiring the noise voltage produced by each driver at different frequencies. In FIG. 5, a partial circle structure is schematically shown. To apply the corresponding input voltages VCC (such as VCC 5/3.3/2.9V) of different ICs, each input voltage pad VCC and each ground pad GND are serially connected as a circle to form a partial circle structure with a common voltage source, as shown in FIG. 5. In this structure, when the set voltage from the source supply 1 is input to and changed by any one pad, an internal IC reference voltage is also changed. Thus, during testing, the set voltage can be changed based on the system input voltage (from the power supply 1, for example, 5V or 3.3V.

Figure 6:
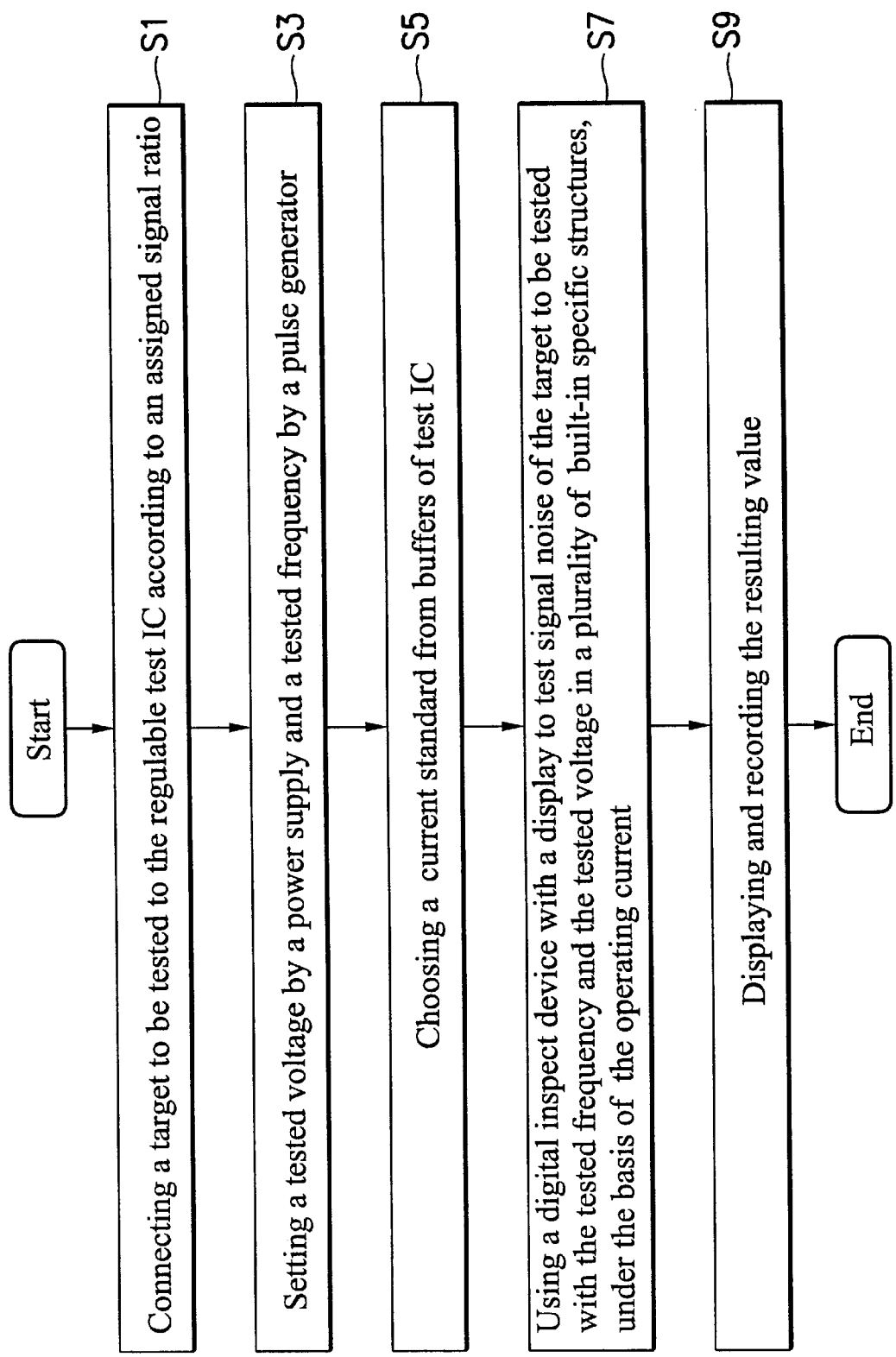
FIG. 6 is a flowchart of the test method for signal noise according to the invention.

Refer to FIG. 6, a flowchart of the test method for signal noise of the invention. In FIG. 6, the method comprises the steps of: connecting a target to be tested to the regulable test IC according to an assigned signal ratio (S1); setting a test voltage by a power supply and a test frequency by a pulse generator (S3); choosing a current standard (S5); using a digital detection device with a display to test the signal noise of the target to be tested with the test frequency and the test voltage in a plurality of built-in specific structures, under the chosen current standard (S7); displaying and recording the resulting value (S9).

As shown in FIG. 6, in step S1, the target to be tested can be an IC package or a 3D structure including IC package (s)/connector(s)/PCB(s). The assigned signal ratio is assigned by a user. Thus, according to the assigned signal, for example, a signal ratio 8:1, the target to be tested is connected in such a way that 7 pins to Active pads and 1 pin to Quiet pad of the regulable test IC, as shown in FIG. 3 and FIG. 7b. In addition, of the two pins immediately adjacent to both sides of the 8 pins, one is connected to the VCC pad, and the other is connected to the GND pad. In step S3, a test voltage is set on a power supply, e.g. 5V, and a test frequency by a pulse generator, e.g. 500 MHz. In step S5, an operating current is selected from the predetermined four quadrants, e.g. 10 mA. In step S7, a digital detection device with a display, for example, an oscilloscope, is used to test signal noise of the target to be tested with the test frequency and the test voltage in a plurality of built-in specific structures, under the basis of the operating current. For example, under the conditions of an operating current 10 mA, a test frequency 500 MHz and a test voltage 5V in conjunction with the plurality of built-in specific structures, i.e. the structures as shown in FIGS. 3–5, the signal noise is easily tested by the probe of the oscilloscope. The resulting data, in step S9, is displayed and recorded by the digital detection device on its display.

[First Embodiment]

Figure 7A:
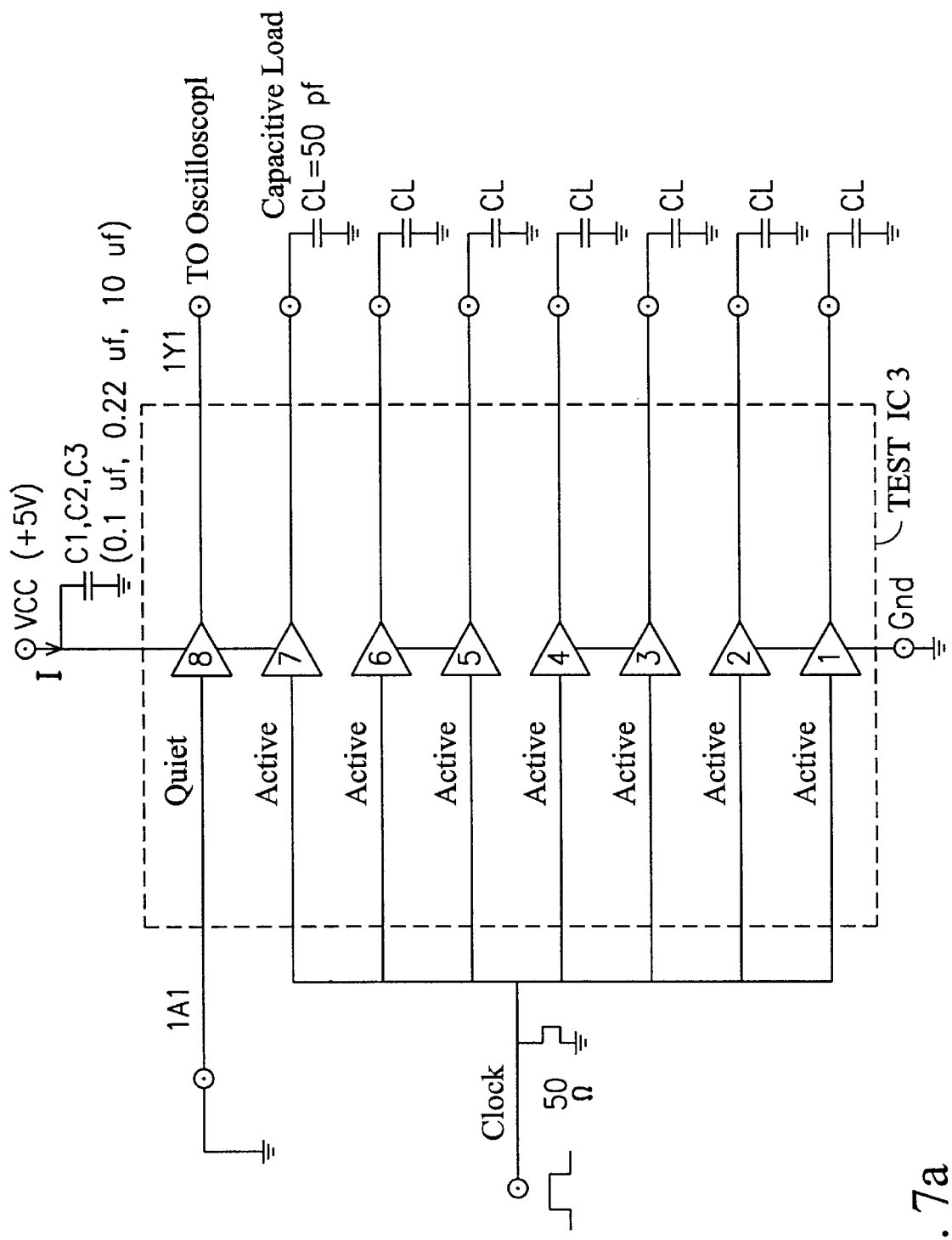
FIG. 7 is an embodiment of the invention including a wiring for the test.
Figure 7B:
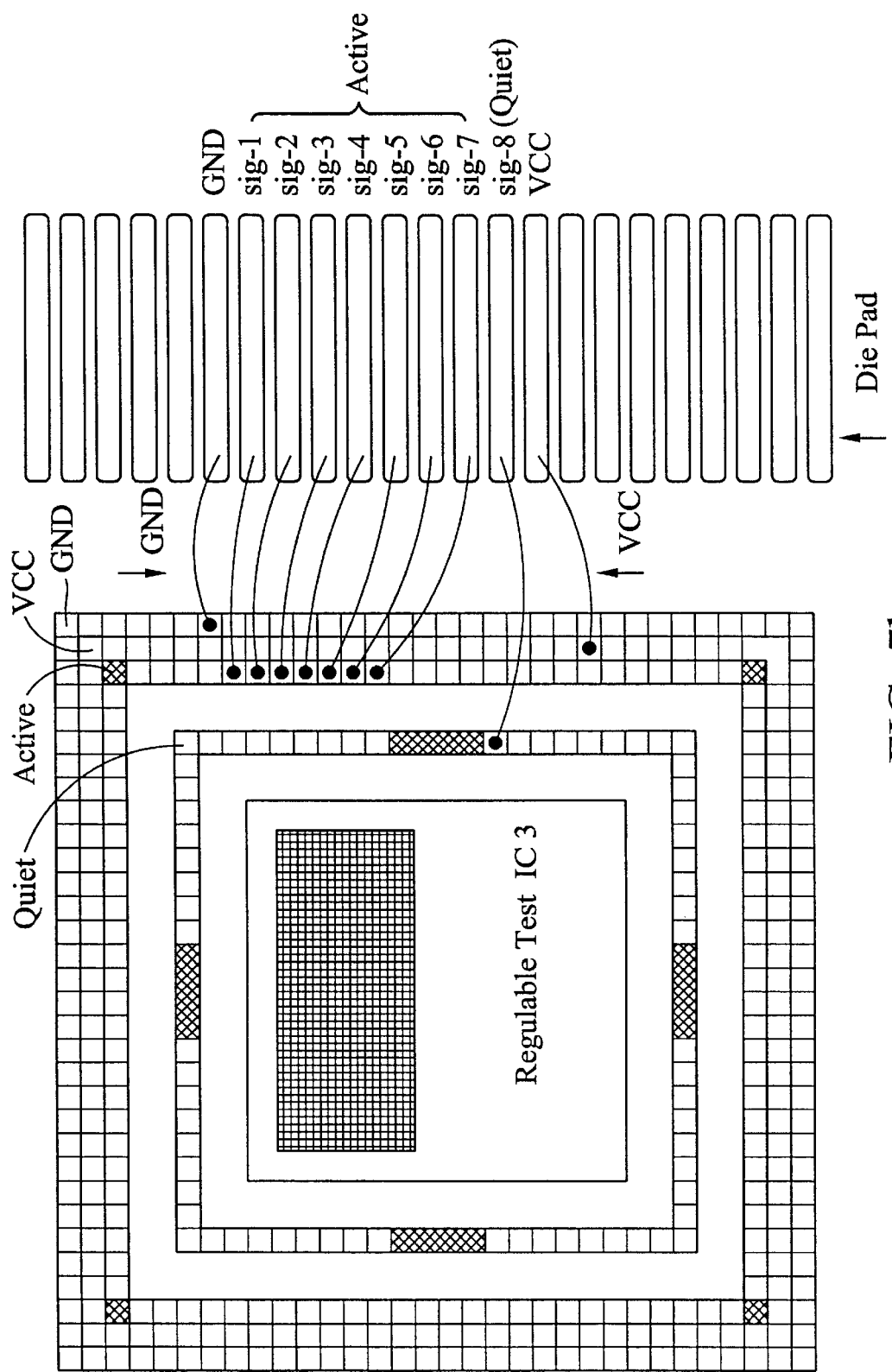

Refer to FIG. 7, the embodiment of a simultaneous switch noise test IC for an IC package device and its corresponding wiring illustration. In FIG. 7a, a wiring diagram from FIG. 1 includes a power supply VCC, a pulse input source Clock, a test IC, a plurality of outputs for externally connecting to oscilloscope(s) and target(s) according to the assigned signal ratio (total signal pins to Quiet signal pins). As shown in FIG. 7a, the output of the power supply 1 is connected to the power input of the output buffer driver 8 of the test IC 3 for supplying the voltage 5V to the test IC 3, and the ground pin of the output buffer driver 1 of the test IC 3 is connected to the ground; thus, a system current I is created. The output of the pulse generator 2 is connected in parallel to the data inputs of all the output buffer drivers with Active signal, for example the drivers 1–7, for providing the digital test signal required by the signal noise test. The data outputs of all output buffer drivers with Active signal are connected to a capacitive load 50 pf (instead of, the inputs of a target to be tested) as shown in FIG. 7a). The data output of the driver 8 is connected floating to the digital detection device 4 (such as the probe of the oscilloscope), and the data input of the driver 8 is connected to the Quiet signal, i.e. to the ground. In the system, resistor 50 Ω is used to stabilize the system impedance match, so as to have a stable output of the pulse signal; C1, C2, C3 are the decoupling capacitor to reduce the power noise from line couplings. When a test frequency from the pulse generator 2 and a test voltage from power supply 1 are input (FIG. 1) and floated to an oscilloscope, the desired noise value of this embodiment is displayed and recorded on the display of the oscilloscope. For example, the noise from a path of a test IC body to a solder ball via a wire bonding of a package and a trace or leadframe of the package is displayed and recorded on the display of the oscilloscope (Appendix A).

Refer FIG. 7b, a further description of the wiring portion according to the signal to power pin ratio as shown in FIG. 7a. In FIG. 7b, a regulable test IC socket and a plurality of die pads are included. As shown in FIG. 7b, under a signal ratio (total signal pins to Quiet signal pins) of 8:1, a tested target (package device) is mounted on the socket in order to test its simultaneous switch noise value, i.e., the varying voltage as the logic value is alternated. The result of the test is probed with the oscilloscope 4 through the floating line 1Y1 and shown on the display of the oscilloscope 4. In such a case, the tested noise in such a wiring is the worst case, because the noises from all loads are concent frequencyd on only one output (due to Quiet=0V). If there are two outputs connected to the oscilloscope 4, i.e. the signal ratio (total signal pins to Quiet signal pins) 8:2, the noises of the loads are evenly distributed by the two outputs; therefore, the noise value probed from any one of the two outputs is reduced, and so on. A pattern is found: the smaller signal ratio, the smaller noise value.

[Second Embodiment]

Figure 8:
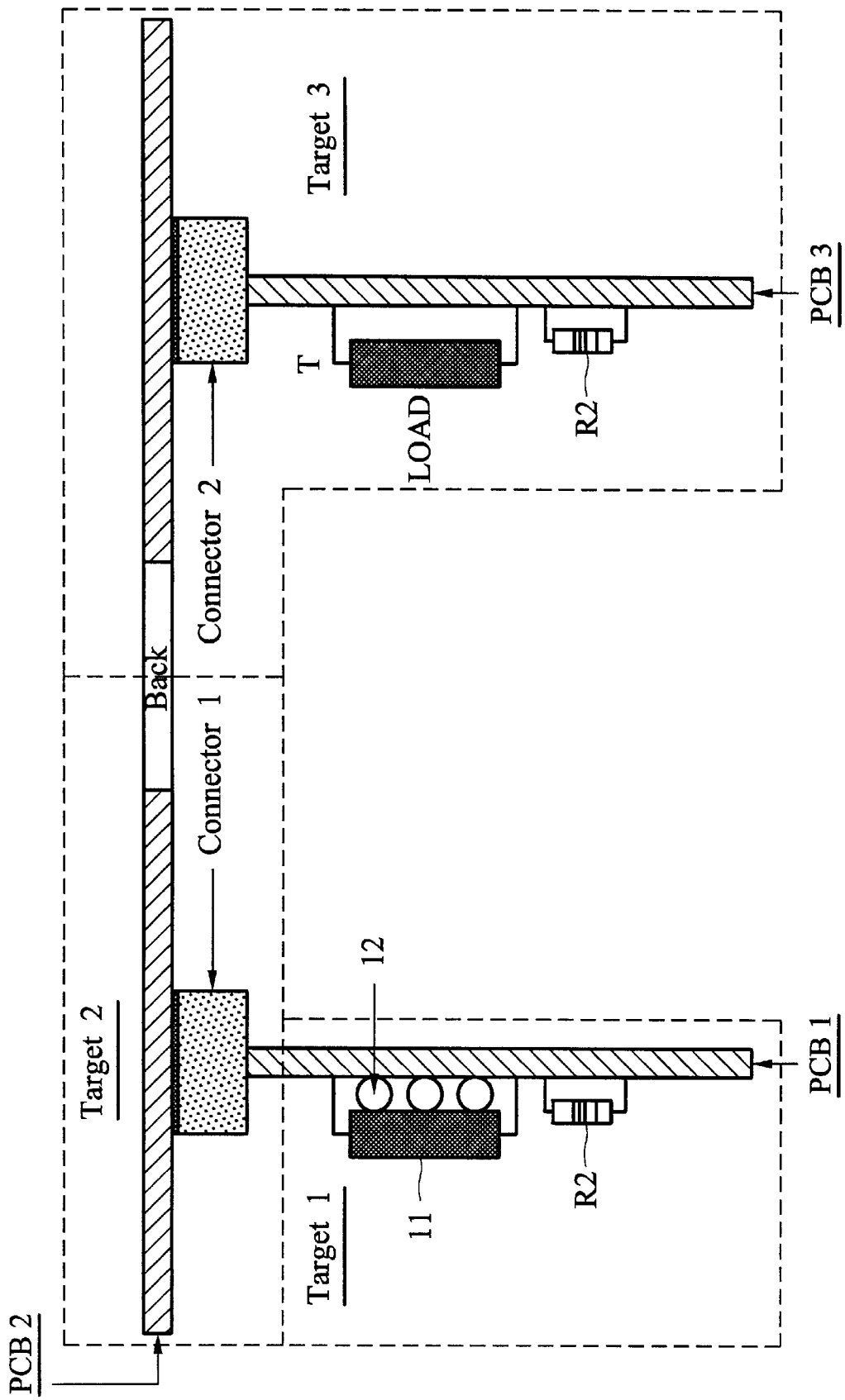
FIG. 8 is another embodiment of the invention.

Refer to FIG. 8, the second embodiment of the invention, which illustfrequencys an application of a 3D structure. In FIG. 8, Connector 1 and Connector 2 are on the back of a PCB 2. In addition, Connector 1 is connected to a PCB 1 and Connector 2 is connected to a PCB 3. The PCB 1 is connected to a noise test device 11 and the PCB 3 is connected to a load LOAD. Any one end of the load LOAD is floated to the probe of an oscilloscope (not shown). As shown in FIG. 8, the device 11 is mounted on the PCB 1 with a resistor R1 for stabilizing voltage and the load LOAD is mounted on the PCB 3 with a resistor R2 for stabilizing voltage. When testing a noise value of a path from the device 11 to each PCB via Connector 1 and/or Connector 2, the method is identical with the first embodiment. However, the noise content is different in the two embodiments. In this embodiment, the structure is divided into three parts as represented in Target 1, Target 2, and Target 3. The noise sources of Target 1 comprise the wire bonding of the device 11 (see FIG. 7b), IC socket's lines and the traces of PCB 1, and solder balls 12, which are identified with the noise sources of FIG. 7a. The noise sources of Target 2 comprise Connector 1 and the traces of PCB 2. The noise sources of Target 3 comprise Connector 2, the traces of PCB 3, and the leadframe of the load LOAD. The composition of the three Targets constitutes the entire noise sources of this embodiment. Therefore, the noise value is achieved by testing point T with the probe of the oscilloscope. As a result, the noise value is shown and recorded on the display of the oscilloscope (see Appendix A).

The invention provides a novel electrical design method for directly testing active parameters (digital testing), e.g. PCBs, connectors, and the like, so that the time needed for testing is shorter than that in the art. In such a way, the resulting value of the noise test is more accurate than the prior art, particularly in testing passive devices, e.g. L, C, R. Further, unlike the prior art, the invention is capable of testing a 3D structure and its parasitics electrical effects.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A regulable test IC system for signal noise, comprising:

a power supply, for providing a test voltage in the system;

a pulse generator, for providing a test frequency in a noise testing of the system;

a plurality of current drivers, distributed in a plurality of quadrants of the test IC system, for providing an assigned current standard;

a regulable test IC with different signal pads capable of regulable testing signal noise with the test frequency from the pulse generator and the test votlage from the power supply in a plurality of built-in specific structure, under the basis of the assigned current standard, wherein the built-in specific structure comprises a multiple parallel structure, a serial frequency input structure, and a partial circle structure; and a digital detection device with a display, for displaying and recording the result of the regulable test.

2. The regulable test IC system of claim 1, wherein the multiple parallel structure is formed by connecting each same signal pad in series, thereby producing a plurality of parallel signal pad structures.

3. The regulable test IC system of claim 1, wherein the serial frequency input structure is formed by connecting a test frequency input signal pad of one of the different signal pads on each quadrant as a circle.

4. The regulable test IC system of claim 1, wherein the partial circle structure is formed by connecting power input signal pad of one of the different signal pads on each quadrant as a circle, and by connecting the ground signal pad of one of the different signal pads on each quadrant as a circle.

5. The regulable test IC system of claim 1, wherein the digital detection device is an oscilloscope.

* * * * *